(12) United States Patent
Fukui et al.

(10) Patent No.: US 10,243,135 B2
(45) Date of Patent: Mar. 26, 2019

(54) PIEZOELECTRIC DEVICE AND METHOD FOR MANUFACTURING PIEZOELECTRIC DEVICE

(71) Applicant: Panasonic Intellectual Property Management Co., Ltd., Osaka (JP)

(72) Inventors: Takafumi Fukui, Osaka (JP); Kiyoshi Yamakoshi, Osaka (JP); Yoshiko Higashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 350 days.

(21) Appl. No.: 15/074,005

(22) Filed: Mar. 18, 2016

(65) Prior Publication Data

US 2016/0284979 A1 Sep. 29, 2016

(30) Foreign Application Priority Data

Mar. 27, 2015 (JP) ................................ 2015-065865

(51) Int. Cl.
| | |
|---|---|
| H01L 41/277 | (2013.01) |
| H01L 41/08 | (2006.01) |
| H01L 41/314 | (2013.01) |
| H01L 41/319 | (2013.01) |
| H01L 41/187 | (2006.01) |

(52) U.S. Cl.
CPC ........ *H01L 41/0815* (2013.01); *H01L 41/314* (2013.01); *H01L 41/319* (2013.01); *H01L 41/1876* (2013.01)

(58) Field of Classification Search
CPC . H01L 41/0815; H01L 41/314; H01L 41/319; H01L 41/1876
See application file for complete search history.

(56) References Cited

U.S. PATENT DOCUMENTS

| | | | |
|---|---|---|---|
| 2002/0097305 A1 | 7/2002 | Sumi | |
| 2007/0228894 A1* | 10/2007 | Ishikura | ................... B41J 2/161 310/363 |
| 2010/0192341 A1 | 8/2010 | Ishikura et al. | |
| 2012/0056508 A1* | 3/2012 | Horikiri | ............. H01L 41/0805 310/317 |
| 2013/0250009 A1* | 9/2013 | Ishimori | ............. H01L 41/0805 347/70 |

(Continued)

FOREIGN PATENT DOCUMENTS

| | | |
|---|---|---|
| JP | 2000-079689 A | 3/2000 |
| JP | 2001-111126 A | 4/2001 |

(Continued)

*Primary Examiner* — Bryan P Gordon
(74) *Attorney, Agent, or Firm* — McDermott Will & Emery LLP (57) ABSTRACT

A piezoelectric device includes a substrate, a lower electrode disposed above the substrate, a lower bonding layer disposed on the lower electrode, a piezoelectric layer containing a piezoelectric material disposed on an upper surface of the lower bonding layer, and an upper electrode disposed above the piezoelectric layer. The lower bonding layer includes an electrode material portion containing an electrode material of the lower electrode and a piezoelectric material portion containing a piezoelectric material. The electrode material portion and the piezoelectric material portion interdigitate with each other in the lower bonding layer.

19 Claims, 5 Drawing Sheets

(56) References Cited

U.S. PATENT DOCUMENTS

| | | | |
|---|---|---|---|
| 2014/0043815 A1* | 2/2014 | Chuang | F21V 29/004 362/249.02 |
| 2014/0267504 A1 | 9/2014 | Ohashi et al. | |
| 2015/0084486 A1* | 3/2015 | Eguchi | H01L 41/0477 310/360 |
| 2015/0228886 A1* | 8/2015 | Abbott, Jr. | H01L 41/319 347/71 |

FOREIGN PATENT DOCUMENTS

| | | |
|---|---|---|
| JP | 2007-283729 A | 11/2007 |
| JP | 2007-300071 | 11/2007 |
| JP | 2014-175577 A | 9/2014 |

* cited by examiner

PIEZOELECTRIC DEVICE AND METHOD FOR MANUFACTURING PIEZOELECTRIC DEVICE

FIELD OF THE INVENTION

The present disclosure relates to a piezoelectric device and a method for manufacturing the piezoelectric device.

BACKGROUND ART

A piezoelectric device has a piezoelectric effect that converts mechanical energy, such as vibrations or pressure, into electrical energy. For instance, when strain is applied to a piezoelectric device, electric power is generated according to the magnitude of the applied strain. Accordingly, a piezoelectric device may be used for, e.g. an electric generator. Further, a piezoelectric device has a reverse piezoelectric effect that converts electric energy into mechanical energy. For instance, when a voltage is applied to a piezoelectric device, the piezoelectric device deforms. Accordingly, a piezoelectric device may be used for, e.g. a sensor or an ink-jet head.

A conventional piezoelectric device includes a substrate, a lower electrode, a piezoelectric film, and an upper electrode. The lower electrode is formed on the substrate. The piezoelectric film is interposed between the lower electrode and the upper electrode. The piezoelectric film employs, for example, lead zirconate titanate (PZT). The lower electrode includes a conductive metal layer, a mixture layer, and a conductive oxide layer. The mixture layer contains conductive metal and conductive oxide. Thus, the mixture layer between the conductive metal layer and the conductive oxide layer prevents the conductive metal layer from being peeled off from the conductive oxide layer in the lower electrode.

A conventional piezoelectric device similar to the above piezoelectric device is disclosed in, e.g. Japanese Patent Laid-Open Publication No. 2007-300071.

SUMMARY

A piezoelectric device includes a substrate, a lower electrode formed on the substrate, a lower bonding layer that is formed on the lower electrode and made of an electrode material, a piezoelectric layer that is formed on the lower bonding layer and contains a piezoelectric material, and an upper electrode formed above the piezoelectric layer. The lower bonding layer includes an electrode material portion containing the electrode material of the lower electrode, and a piezoelectric material portion containing the piezoelectric material. In the lower bonding layer, the electrode material portion and the piezoelectric material portion interdigitate with each other.

A piezoelectric device may be manufactured in the following method. A lower bonding material paste obtained by mixing the piezoelectric material paste and the lower electrode material paste is provided. A lower electrode material layer is formed by applying the lower electrode material paste so as to form the lower electrode above a substrate. A lower bonding material layer is formed by applying the lower bonding material paste on an upper surface of the lower electrode material layer so as to form the lower bonding material layer on the upper surface of the lower electrode material layer. A piezoelectric material layer is formed by applying the piezoelectric material paste on an upper surface of the lower bonding material layer so as to form the piezoelectric layer on the upper surface of the lower bonding material layer. An upper electrode material layer ids formed by applying an upper electrode material paste so as to form an upper electrode above the piezoelectric material layer. The lower electrode material layer, the lower bonding material layer, the piezoelectric material layer, and the upper electrode material layer are fired to manufacture the piezoelectric device.

The piezoelectric device and the method for manufacturing the piezoelectric device can prevent the piezoelectric layer from being peeled off from and the lower electrode.

DETAILED DESCRIPTION OF PREFERRED EMBODIMENT

A piezoelectric device and a method for manufacturing the piezoelectric device in accordance with an exemplary embodiment of the present disclosure will be detailed below with referring to drawings. Note that, the exemplary embodiment described below shows a preferable embodiment of the present disclosure. Accordingly, a numerical value, a shape, a material, elements, an arrangement of these elements, and a connection form thereof indicated in the exemplary embodiment are described as one example, and not intended to restrict the present disclosure. Therefore, an element not recited in an independent claim, which describes the broadest concept of the present invention, among the elements in the following exemplary embodiment is explained as an arbitrary element.

Further, each figure is illustrated as a schematic diagram, but not necessary to be an exact diagram. In each figure, the same reference numerals are assigned to the substantially same components, and redundant description thereof is omitted.

Figure 1:
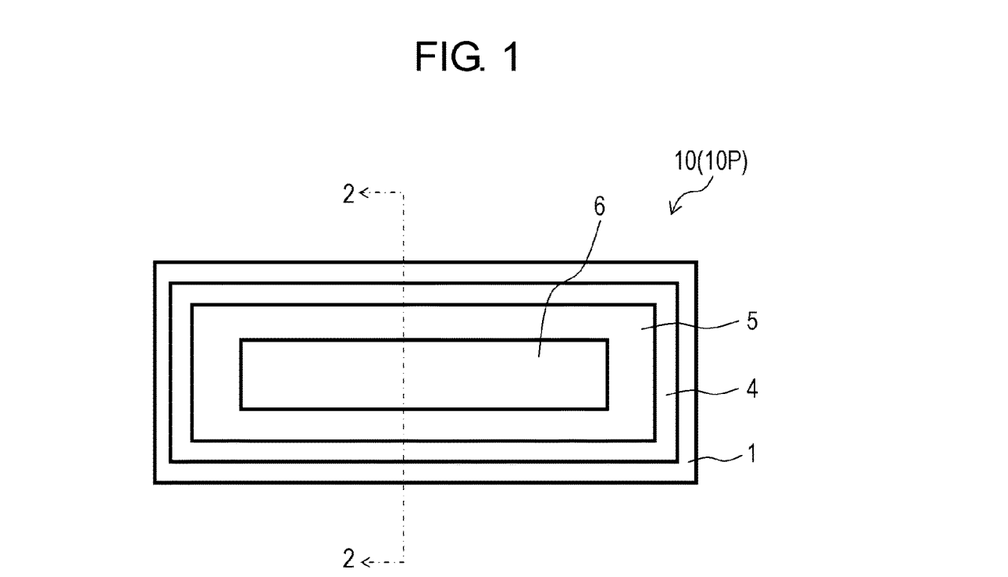
FIG. 1 is a schematic top view of a piezoelectric device in accordance with an exemplary embodiment.
Figure 2:
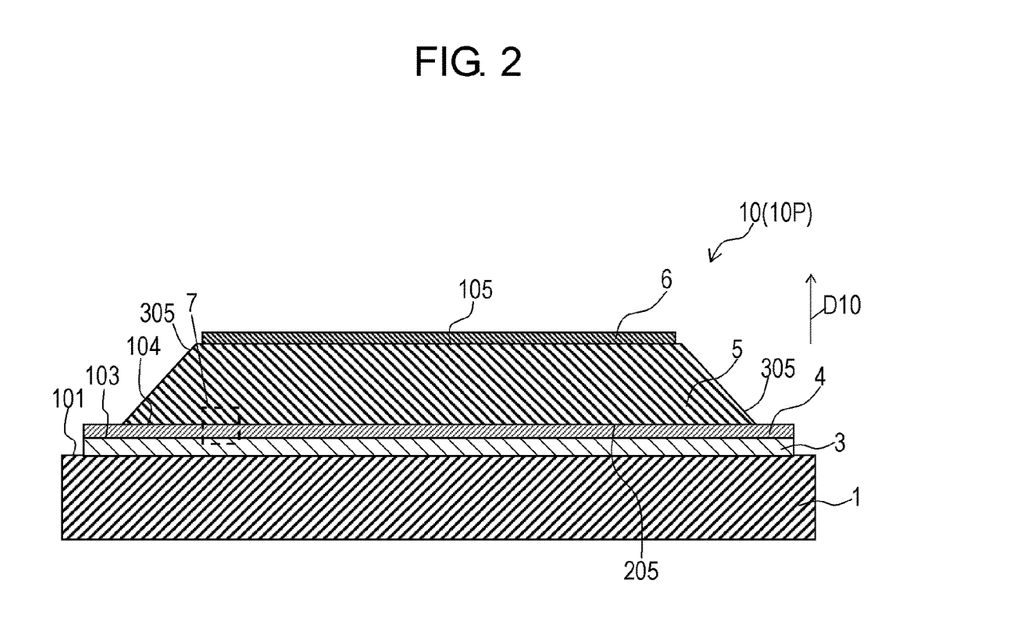
FIG. 2 is a cross-sectional view of the piezoelectric device on line 2-2 shown in FIG. 1.

FIG. 1 is a schematic top view of piezoelectric device 10 in accordance with an exemplary embodiment. FIG. 2 is a cross-sectional view of piezoelectric device 10 on line 2-2 shown in FIG. 1.

Upon receiving mechanical energy, such as a vibration or pressure, piezoelectric device 10 generates electric charges, thereby converting the mechanical energy into electric energy.

Piezoelectric device 10 includes substrate 1, lower electrode 3, lower bonding layer 4, piezoelectric layer 5, and upper electrode 6. Substrate 1, lower electrode 3, lower bonding layer 4, piezoelectric layer 5, and upper electrode 6 are stacked in this order in thickness direction D10. Lower electrode 3 is disposed on upper surface 101 of substrate 1. Lower bonding layer 4 is disposed on upper surface 103 of lower electrode 3. Piezoelectric layer 5 is disposed on upper surface 104 of lower bonding layer 4. Upper electrode 6 is disposed on upper surface 105 of piezoelectric layer 5.

Substrate 1 is a base of piezoelectric device 10. Substrate 1 is made of a ceramic plate or a metal plate, such as stainless steel.

Lower electrode 3 is one electrode for extracting the electric charges generated in piezoelectric layer 5. Lower electrode 3 is made of a conductive electrode material containing, e.g. metal. Lower electrode 3 is disposed above upper surface 101 of substrate 1. That is, another layer may be formed between lower electrode 3 and upper surface 101 of substrate 1. The electrode material is, for example, an alloy of silver and palladium. The thickness of lower electrode 3 is determined depending on the size of piezoelectric device 10 or the amount of a current flowing through lower electrode 3. According to the embodiment, the thickness is 5 µm.

In the conventional piezoelectric device mentioned above, the piezoelectric layer has a thermal expansion coefficient largely different from that of the lower electrode. Accordingly, in the conventional piezoelectric device, the piezoelectric layer tends to be peeled off from the lower electrode.

In piezoelectric device 10 according to the embodiment, lower bonding layer 4 increases adhesion strength between lower electrode 3 and piezoelectric layer 5. Lower bonding layer 4 prevents lower electrode 3 from being peeled off from piezoelectric layer 5.

Figure 3:
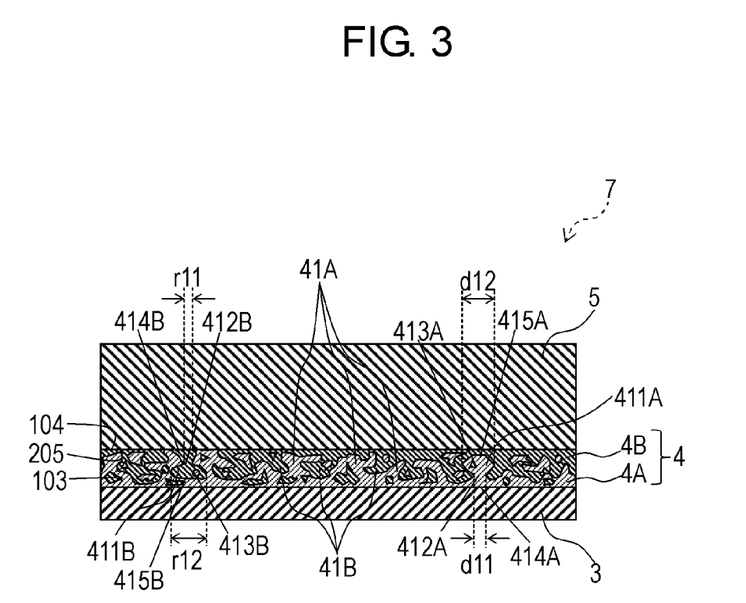
FIG. 3 is an enlarged cross-sectional view of the piezoelectric device in accordance with the embodiment for partially illustrating a lower bonding layer of the piezoelectric device.

FIG. 3 is an enlarged cross-sectional view of partial area 7 of lower bonding layer 4.

Lower bonding layer 4 is disposed on upper surface 103 of lower electrode 3, i.e., is disposed between lower electrode 3 and piezoelectric layer 5. Lower bonding layer 4 includes electrode material portion 4A and piezoelectric material portion 4B. Electrode material portion 4A contains the above electrode material of lower electrode 3. Piezoelectric material portion 4B contains the piezoelectric material of piezoelectric layer 5. In lower bonding layer 4, a ratio of a weight of electrode material portion 4A to a weight of piezoelectric material portion 4B ranges from 12/88 to 55/45.

The electrode material of electrode material portion 4A has the same component as the electrode material of lower electrode 3. The piezoelectric material of piezoelectric material portion 4B has the same component as the piezoelectric material of piezoelectric layer 5.

In lower bonding layer 4, electrode material portion 4A and piezoelectric material portion 4B interdigitate with each other. Further, electrode material portion 4A and piezoelectric material portion 4B are distributed non-uniformly. The state where electrode material portion 4A and piezoelectric material portion 4B are non-uniformly distributed means that electrode material portion 4A and piezoelectric material portion 4B exist independently in a cross-section. Accordingly, electrode material portion 4A and piezoelectric material portion 4B can be distinguished from each other. That is, in lower bonding layer 4, the electrode material constituting electrode material portion 4A and the piezoelectric material constituting piezoelectric material portion 4B do not form a diffusion layer which is produced by mutual diffusion and does not exhibit a clear boundary. Further, the electrode material and the piezoelectric material have, compositionally, no uniform gradients extending from lower electrode 3 toward piezoelectric layer 5. The electrode material and the piezoelectric material are distributed randomly. Note that, a part of the electrode material may be distributed within piezoelectric material portion 4B. Further, a part of the piezoelectric material may be distributed within electrode material portion 4A.

Electrode material portion 4A includes protrusions 41A which protrude from lower electrode 3 toward piezoelectric layer 5 and are bonded to upper surface 103 of lower electrode 3. Protrusions 41A are made of the same material as the electrode material of lower electrode 3. Accordingly, protrusions 41A are bonded unitarily to lower electrode 3.

Protrusions 41A are covered with piezoelectric material portion 4B bonded to lower surface 205 of piezoelectric layer 5. The piezoelectric material fills between protrusions 41A. That is, protrusions 41A are embedded in piezoelectric material portion 4B. Piezoelectric material portion 4B is made of the same material as the piezoelectric material of piezoelectric layer 5. Therefore, piezoelectric material portion 4B is bonded unitarily to piezoelectric layer 5.

Protrusion 411A out of protrusions 41A has root 414A bonded to upper surface 103 of lower electrode 3 and tip end 415A opposed to root 414A. Protrusion 411A extends from root 414A to tip end 415A. In protrusion 411A out of protrusions 41A, portion 413A of tip end 415A has diameter d12 larger than diameter d11 of portion 412A of root 414A. In protrusion 411A, portion 413A having diameter d12 is located closer to piezoelectric layer 5 than portion 412A having diameter d11. Portion 412A of protrusion 411A is located closer to root 414A than portion 413A of protrusion 411A. Some protrusions 41A among the plurality of protrusions 41A have the same shape as protrusion 411A.

Piezoelectric material portion 4B includes protrusions 41B which protrude from piezoelectric layer 5 toward lower electrode 3 and are bonded to lower surface 205 of piezoelectric layer 5. Protrusions 41B are made of the same material as the piezoelectric material of piezoelectric layer 5. Accordingly, protrusions 41B are bonded unitarily to piezoelectric layer 5.

Protrusions 41B are covered with electrode material portion 4A bonded to upper surface 103 of lower electrode 3. The electrode material fills between protrusions 41B. That is, protrusions 41B are embedded in electrode material portion 4A. Electrode material portion 4A is made of the same material as the electrode material of lower electrode 3. Accordingly, electrode material portion 4A is bonded unitarily to lower electrode 3.

Protrusion 411B out of protrusions 41B includes root 414B bonded to piezoelectric layer 5 and tip end 415B opposite to root 414B. Protrusion 411B extends from root 414B to tip end 415B. In protrusion 411B out of protrusions 41B, portion 413B of tip end 415B has diameter r12 larger than diameter r11 of portion 412B of root 414B. In protrusion 411B, portion 413B having diameter r12 is located closer to lower electrode 3 than portion 412B having diameter r11. Portion 412B of protrusion 411B is located closer to root 414B than portion 413B of protrusion 411B. Some protrusions 41B out of protrusions 41B have the same shape as protrusion 411B.

Piezoelectric device 10 includes electrode material portion 4A disposed between portions of piezoelectric material portion 4B in thickness direction D10 of piezoelectric device 10. Accordingly, in lower bonding layer 4, piezoelectric material portion 4B has a structure hooked with electrode material portion 4A. That is, electrode material portion 4A interdigitate with piezoelectric material portion 4B.

This configuration increases the adhesiveness between lower electrode 3 and piezoelectric layer 5.

Piezoelectric layer 5 can convert force applied to piezoelectric device 10 into a voltage.

Piezoelectric layer 5 containing a piezoelectric material is disposed on upper surface 104 of lower bonding layer 4. Piezoelectric layer 5 has upper surface 105 closer to upper electrode 6 and lower surface 205 closer to lower electrode 3 than upper surface 105. Piezoelectric layer 5 has substantially a trapezoidal cross section. In the cross section of piezoelectric layer 5, a width of lower surface 205 is larger than that of upper surface 105. Further, side surface 305 connected to upper surface 105 and lower surface 205 of piezoelectric layer 5 extends obliquely upward at an acute angle with respect to lower surface 205 of piezoelectric layer 5.

Piezoelectric layer 5 contains, e.g. a ceramic material, or a single crystal material. Piezoelectric layer 5 is made of, e.g. lead zirconate titanate, aluminum nitride, lithium niobate, lithium tantalate, or crystal. Note that, piezoelectric layer 5 may preferably be made of piezoelectric materials expressed as the following compositional formula:

$Pb_{1.015}Zr_{0.44}Ti_{0.46}(Zn_{1/3}Nb_{2/3})_{0.10}O_{3.015}$.

The piezoelectric material expressed as the above compositional formula has superior piezoelectric properties. In the piezoelectric material expressed as the compositional formula, $Pb(Zn_{1/3}Nb_{2/3})O_3$ is substituted for B-site of lead zirconate titanate (PZT) at 10 mole percent. The ratio of Pb-site is 1.015, which exceeds stoichiometry.

Further, compressive stress may previously be applied to piezoelectric layer 5. To apply the compressive stress to piezoelectric layer 5, thermal expansion of substrate 1 can be used in a process for manufacturing the device. Therefore, the material of substrate 1 preferably has a large thermal expansion coefficient. For instance, substrate 1 is preferably made of a metal plate, such as stainless steel.

Even upon deforming, piezoelectric layer 5 having the compressive stress applied thereto can hardly break. Therefore, upon deforming largely, piezoelectric device 10 includes piezoelectric layer 5 having compressive stress is applied thereto can generate large electric energy.

Upper electrode 6 extracts electric charges generated in piezoelectric layer 5. Upper electrode 6 is made of a conductive electrode material containing, e.g. conductive metal. Upper electrode 6 is disposed above piezoelectric layer 5. The electrode material is, e.g. gold or copper. Further, an alloy of silver and palladium, which is the same electrode material as lower electrode 3, may be employed as an electrode material of upper electrode 6. The thickness of upper electrode 6 is determined depending on the size of piezoelectric device 10 or the amount of a current flowing through upper electrode 6. According to the embodiment, the thickness is, for example, 2 μm. The thickness of upper electrode 6 may be the same as that of lower electrode 3.

A method for manufacturing piezoelectric device 10 will be described below.

FIGS. 4A to 4D are cross-sectional views of piezoelectric device 10 for illustrating the method for manufacturing piezoelectric device 10.

Figure 4A:
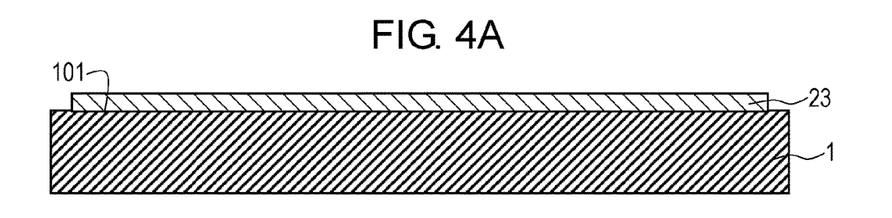
FIG. 4A is a cross-sectional view of the piezoelectric device in accordance with the embodiment from illustrating a method for manufacturing the piezoelectric device.

As shown in FIG. 4A, a lower electrode material paste is applied on upper surface 101 of substrate 1 by screen printing so as to form lower electrode 3 on upper surface 101 of substrate 1. Lower electrode material layer 23 is thus formed on the upper surface of substrate 1. Substrate 1 is a heat-resistant stainless steel plate, such as SUS 430, containing a small amount of aluminum. Substrate 1 has, for example, a width of 12.5 mm, a length of 18 mm, and a thickness of 0.1 mm. The size of substrate 1 is determined depending on application of piezoelectric device 10.

The lower electrode material paste contains, for example, silver-palladium alloy particles containing 90% silver and 10% palladium. The silver-palladium alloy particles preferably have diameters of, for example, about 0.9 μm. Lower electrode material layer 23 has, for example, a width of 12 mm, a length of 12 mm, and a thickness of 5 μm.

Figure 4B:
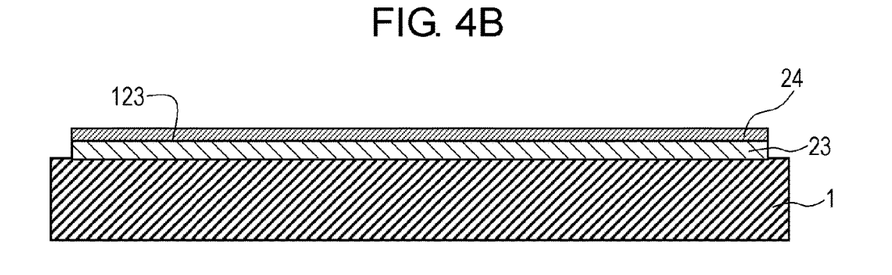
FIG. 4B is a cross-sectional view of the piezoelectric device in accordance with the embodiment from illustrating the method for manufacturing the piezoelectric device.

Next, as shown in FIG. 4B, the lower bonding material paste is applied on upper surface 123 of the applied lower electrode material layer 23 by screen printing so as to from lower bonding layer 4. Lower bonding material layer 24 is thus formed on upper surface 123 of lower electrode material layer 23.

The lower bonding material paste is obtained by mixing and kneading the piezoelectric material paste for forming piezoelectric layer 5 and the lower electrode material paste. In the lower bonding material paste, the ratio of the weight of the piezoelectric material to the weight of silver-palladium alloy preferably ranges from 12/88 to 55/45. The piezoelectric material paste and the lower electrode material paste are mixed with, e.g. a three-roll mill. Lower bonding material layer 24 has, for example, a width of 11.9 mm, a length of 11.9 mm, and a thickness of 3 μm.

Figure 4C:
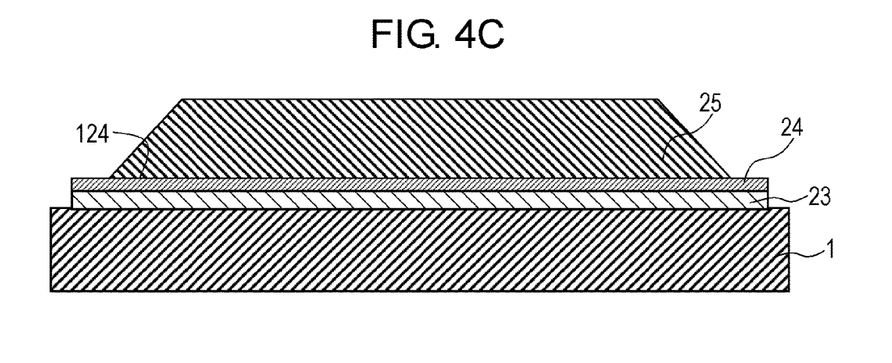
FIG. 4C is a cross-sectional view of the piezoelectric device in accordance with the embodiment from illustrating the method for manufacturing the piezoelectric device.

Next, as shown in FIG. 4C, the piezoelectric material paste is applied on upper surface 124 of the applied lower bonding material layer 24 by screen printing so as to form piezoelectric layer 5. Piezoelectric material layer 25 is thus formed on upper surface 124 of lower bonding material layer 24.

The piezoelectric material paste contains, for example, a piezoelectric material having piezoelectric properties. Piezoelectric material layer 25 has a width of 11.8 mm, a length of 11.8 mm, and a thickness of 35 μm.

The piezoelectric material paste which is used for forming piezoelectric layer 5 and contains the piezoelectric material expressed as the above compositional formulae will be described below.

The piezoelectric material paste is obtained by mixing a piezoelectric material and an organic vehicle together with an appropriate amount of phosphoric acid ester-based dispersant and kneading the mixture thereof. The piezoelectric material is obtained by processing a piezoelectric material composition powder by a solid-phase method. The piezoelectric material is powder.

In order to obtain the piezoelectric material composition powder, powder of lead oxide (PbO), titanium oxide ($TiO_2$), zirconium oxide ($ZrO_2$), zinc oxide (ZnO), and niobium oxide ($Nb_2O_5$) are measured to satisfy the molar ratio expressed as the above compositional formulae. Note that, the power of metal oxides preferably has a purity not less than 99.9%. This facilitates adjusting the molar ratio of the piezoelectric material composition powder. Further, the power of metal oxides preferably has particle diameters smaller than 0.5 μm. This lowers the sintering temperature of piezoelectric layer 5 to a temperature lower than 900° C.

The organic vehicle is made by mixing an organic binder and solvent.

The organic binder may employ at least one of ethyl cellulose resin, acrylic resin, or butyral resin. The solvent may employ, e.g. α-terpineol, dihydro terpinol acetate, or butyl carbitol. The ratio of the weight of the organic binder to the weight of the solvent is, e.g. 2/8.

The piezoelectric material paste is obtained by mixing the organic vehicle and the piezoelectric material together with an appropriate amount of phosphoric acid ester-based dispersant and kneading the mixture thereof. The ratio of the weight of the organic vehicle to the weight of the piezoelectric material is, e.g. 20/80. These materials are kneaded with, e.g. a three-roll mill.

Figure 4D:
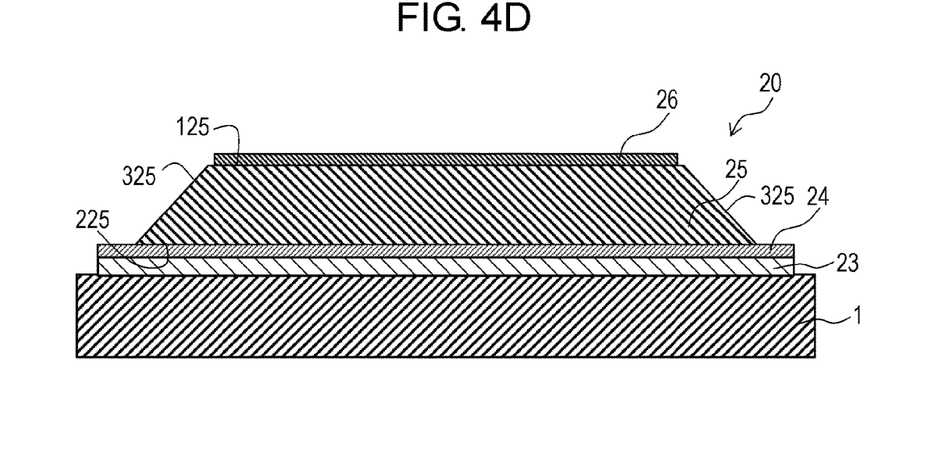
FIG. 4D is a cross-sectional view of the piezoelectric device in accordance with the embodiment from illustrating the method for manufacturing the piezoelectric device.

After that, as shown in FIG. 4D, the upper electrode material paste is applied on upper surface 125 of piezoelectric material layer 25 by screen printing so as to form upper electrode 6. Upper electrode material layer 26 is thus formed on upper surface 125 of piezoelectric material layer 25. A material of the upper electrode material paste is determined appropriately depending on the size or application of piezoelectric device 10. Note that, the material of the upper electrode material paste may be the same as that of the lower electrode material paste. The upper electrode material layer 26 has, for example, a width of 11.1 mm, a length of 11.1 mm, and a thickness of 2 μm.

The above manufacturing processes provide unsintered device 20 is formed.

Subsequently, unsintered device 20 is fired at 850° C. for two hours. In this firing process, unsintered device 20 is put in a firing furnace. The firing process fires and densifies lower electrode material layer 23, lower bonding material layer 24, piezoelectric material layer 25, and upper electrode material layer 26, thereby providing sintered device 10P integrated with substrate 1 (see FIG. 1). Sintered device 10P includes lower electrode 3, lower bonding layer 4, piezoelectric layer 5, and upper electrode 6.

In sintered device 10P, lower electrode 3 and upper electrode 6 have a thickness of, e.g. 5 μm. The thickness of lower bonding layer 4 is not less than 1 μm and less than 10 μm. The thickness of piezoelectric layer 5 is, e.g. 35 μm. Note that, the thickness of each layer is determined appropriately depending on application of piezoelectric device 10.

After that, a voltage of 100 V is applied between lower electrode 3 and upper electrode 6 of sintered device 10P at 120° C. for 30 minutes. The voltage applied under such high temperature polarizes piezoelectric layer 5 of sintered device 10P, thereby providing piezoelectric device 10.

Note that, the way how to apply the pastes is not limited to screen printing. For instance, the pastes may be applied by relief printing, intaglio printing, inkjet, or drawing.

Figure 5A:
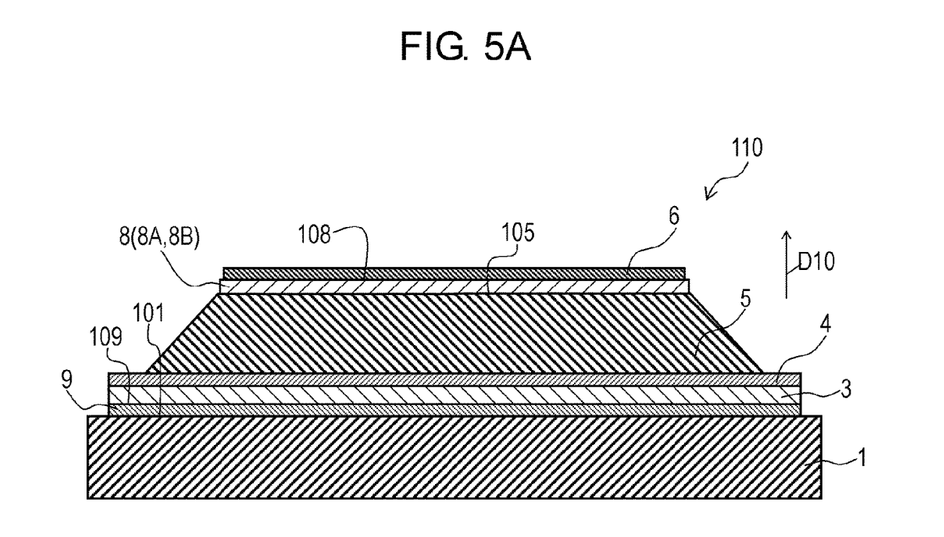
FIG. 5A is a schematic cross-sectional view of another piezoelectric device in accordance with the embodiment.

FIG. 5A is a cross-sectional view of another piezoelectric device 110 in accordance with the embodiment. In FIG. 5A, components identical to those of piezoelectric device 10 shown in FIGS. 1 and 2 are denoted by the same reference numerals.

Piezoelectric device 110 further includes upper bonding layer 8 disposed between piezoelectric layer 5 and upper electrode 6 of piezoelectric device 10 shown in FIGS. 1 and 2.

Upper bonding layer 8 increases adhesion strength between piezoelectric layer 5 and upper electrode 6. Lower bonding layer 4 can prevent upper electrode 6 from being peeled off from piezoelectric layer 5.

Upper bonding layer 8 is disposed on upper surface 105 of piezoelectric layer 5. Upper electrode 6 is disposed on upper surface 108 of upper bonding layer 8. Upper bonding layer 8 includes electrode material portion 8A and piezoelectric material portion 8B. Electrode material portion 8A contains an electrode material of upper electrode 6. Piezoelectric material portion 8B contains the piezoelectric material of piezoelectric layer 5. The electrode material of electrode material portion 8A has the same composition as the electrode material of upper electrode 6. The piezoelectric material of piezoelectric material portion 8B has the same composition as the piezoelectric material of piezoelectric layer 5.

Upper bonding layer 8 has the same configuration as lower bonding layer 4 illustrated in FIG. 3 except for the electrode material of electrode material portion 8A. That is, electrode material portion 8A of upper bonding layer 8 corresponds to electrode material portion 4A of lower bonding layer 4 illustrated in FIG. 3. Piezoelectric material portion 8B of upper bonding layer 8 corresponds to piezoelectric material portion 4B of lower bonding layer 4 illustrated in FIG. 3. That is, upper bonding layer 8 has a configuration that electrode material portion 4A and piezoelectric material portion 4B of lower bonding layer 4 illustrated in FIG. 3 are replaced with electrode material portion 8A and piezoelectric material portion 8B.

Figure 5B:
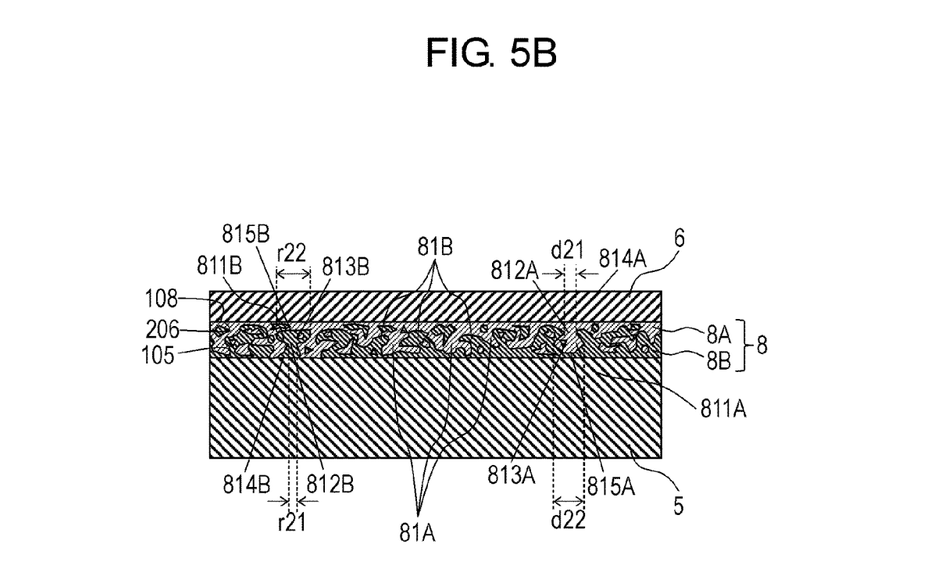
FIG. 5B is an enlarged cross-sectional view of the piezoelectric device shown in FIG. 5A for partially illustrating an upper bonding layer of the piezoelectric device.

Upper bonding layer 8 will be detailed below. FIG. 5B is an enlarged cross-sectional of upper bonding layer 8 for schematically illustrating a part of upper bonding layer 8. In upper bonding layer 8, electrode material portion 8A and piezoelectric material portion 8B interdigitate with each other. Further, electrode material portion 8A and piezoelectric material portion 8B are distributed non-uniformly. Herein, the state where electrode material portion 8A and piezoelectric material portion 8B are non-uniformly distributed means that electrode material portion 8A and piezoelectric material portion 8B exist independently in a cross-section. Accordingly, electrode material portion 8A and piezoelectric material portion 8B can be distinguished from each other. That is, in upper bonding layer 8, the electrode material constituting electrode material portion 8A and the piezoelectric material constituting piezoelectric material portion 8B do not form a diffusion layer which are produced by mutual diffusion between the material layers and exhibit no clear boundary. Further, the electrode material and the piezoelectric material have, compositionally, no uniform gradients extending from upper electrode 6 toward piezoelectric layer 5. The electrode material and the piezoelectric material are distributed randomly. Note that, a part of the electrode material may be distributed within piezoelectric material portion 8B. A part of the piezoelectric material may be distributed within electrode material portion 8A.

Electrode material portion 8A includes protrusions 81A which protrude from upper electrode 6 toward piezoelectric layer 5 and are bonded to lower surface 206 of upper electrode 6. Protrusions 81A are made of the same material as the electrode material of upper electrode 6. Accordingly, protrusions 81A are bonded unitarily to upper electrode 6.

Protrusions 81A are covered with piezoelectric material portion 8B bonded to upper surface 105 of piezoelectric layer 5. The piezoelectric material fills between protrusions 81A. That is, protrusions 81A are embedded in piezoelectric material portion 8B. Piezoelectric material portion 8B is made of the same material as the piezoelectric material of piezoelectric layer 5. Accordingly, piezoelectric material portion 8B is bonded unitarily to piezoelectric layer 5.

Protrusion 811A out of protrusions 81A includes root 814A bonded to lower surface 206 of upper electrode 6 and tip end 815A opposite to root 814A. Protrusion 811A extends from root 814A to tip end 815A. In protrusion 811A out of protrusions 81A, portion 813A of tip end 815A has diameter d22 larger than diameter d21 of portion 812A of root 814A. In protrusion 811A, portion 813A having diameter d22 is located closer to piezoelectric layer 5 than portion 812A having diameter d21. Portion 812A of protrusion 811A is located closer to root 814A than portion 813A of protrusion 811A. Some protrusions 81A out of protrusions 81A have the same shape as protrusion 811A.

Piezoelectric material portion 8B includes protrusions 81B which protrude from piezoelectric layer 5 toward upper electrode 6 and are bonded to upper surface 105 of piezoelectric layer 5. Protrusions 81B are made of the same material as the piezoelectric material of piezoelectric layer 5. Accordingly, protrusions 81B are bonded unitarily to piezoelectric layer 5.

Protrusions 81B are covered with electrode material portion 8A bonded to lower surface 206 of upper electrode 6. The electrode material fills between protrusions 81B. That is, protrusions 81B are embedded in electrode material portion 8A. Electrode material portion 8A is made of the same material as the electrode material of upper electrode 6. Accordingly, electrode material portion 8A is bonded unitarily to upper electrode 6.

Protrusion 811B out of protrusions 81B includes root 814B bonded to piezoelectric layer 5 and tip end 815B opposite to root 814B. Protrusion 811B extends from root 814B to tip end 815B. In protrusion 811B out of protrusions 81B, portion 813B of tip end 815B has diameter r22 larger than diameter r21 of portion 812B of root 814B. In protrusion 811B, portion 813B having diameter r22 is located closer to upper electrode 6 than portion 812B having diameter r21. Portion 812B of protrusion 811B is located closer to root 814B than portion 813B of protrusion 811B. Some protrusions 81B out of protrusions 81B have the same shape as protrusion 811B.

Piezoelectric device 110 thus includes electrode material portion 8A provided between portions of piezoelectric material portion 8B in thickness direction D10 of piezoelectric device 110. Accordingly, in lower bonding layer 8, piezoelectric material portion 8B has a structure hooked by electrode material portion 8A. That is, electrode material portion 8A interdigitates with piezoelectric material portion 8B.

This configuration increases the adhesiveness between upper electrode 6 and piezoelectric layer 5.

Figure 5C:
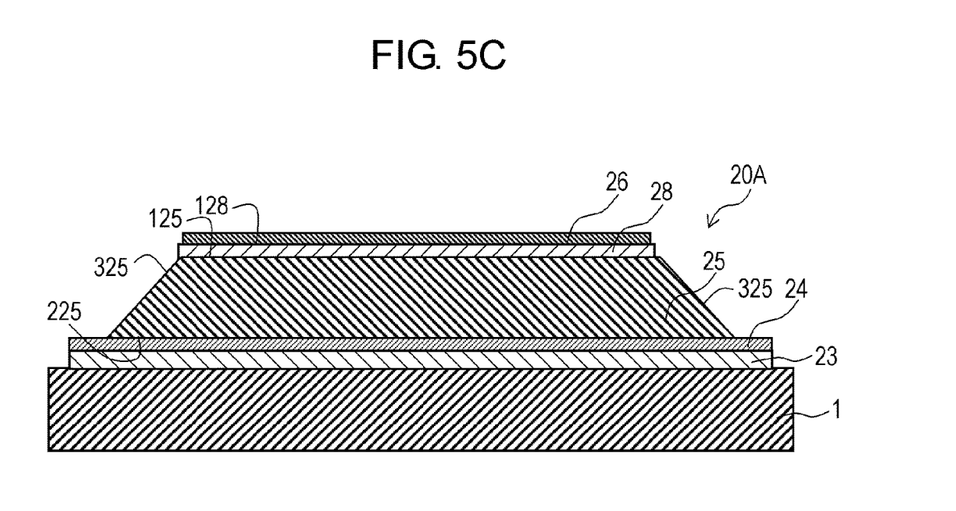
FIG. 5C is a cross-sectional view of the piezoelectric device shown in FIG. 5A for illustrating a method for manufacturing the piezoelectric device shown.

In the above manufacturing method, upper bonding layer 8 is formed such that upper bonding material paste which is obtained by mixing and kneading the piezoelectric material paste and upper electrode paste for forming upper electrode 6 is applied on upper surface 125 of piezoelectric material layer 25 by screen printing.

Piezoelectric device 110 further includes intermediate layer 9 between substrate 1 and lower electrode 3. Intermediate layer 9 is formed on upper surface 101 of substrate 1. Lower electrode 3 is disposed on upper surface 109 of intermediate layer 9.

Intermediate layer 9 increases adhesion strength between substrate 1 and lower electrode 3. Intermediate layer 9 can prevent substrate 1 from being peeled off from lower electrode 3.

Intermediate layer 9 is made of an intermediate layer material containing, e.g. γ-alumina. The thickness of intermediate layer 9 is, e.g. 0.5 μm.

In the above manufacturing method, intermediate layer 9 is formed by applying the intermediate layer material paste on upper surface 101 of substrate 1 by screen printing.

Note that, if substrate 1 and lower electrode 3 are bonded tightly in piezoelectric device 110, intermediate layer 9 is not necessary since lower electrode 3 is hardly peeled off.

FIG. 5C is a cross-sectional view of piezoelectric device 110 illustrated in FIG. 5A for illustrating a method for manufacturing piezoelectric device 110. In FIG. 5C, components identical to those of piezoelectric device 10 illustrated in FIGS. 4A to 4D are denoted by the same reference numerals. Similarly to the lower bonding material paste, the upper bonding material paste is obtained by mixing the piezoelectric material paste for forming piezoelectric layer 5 and the upper electrode material paste, and kneading the mixture thereof. As shown in FIG. 4C, after piezoelectric material layer 25 is formed, the upper bonding material paste is applied on upper surface 125 of piezoelectric material layer 25, as shown in FIG. 5C. After that, as shown in FIG. 5C, the upper electrode material paste is applied on upper surface 128 of upper bonding material layer 28 to form upper electrode material layer 26, thereby providing unsintered device 20A. Subsequently, similarly to piezoelectric device 10, lower electrode material layer 23, lower bonding material layer 24, piezoelectric material layer 25, upper bonding material layer 28, and upper electrode material layer 26 of unsintered device 20A are fired, and then piezoelectric layer 5 is polarized to form piezoelectric device 110.

Figure 6:
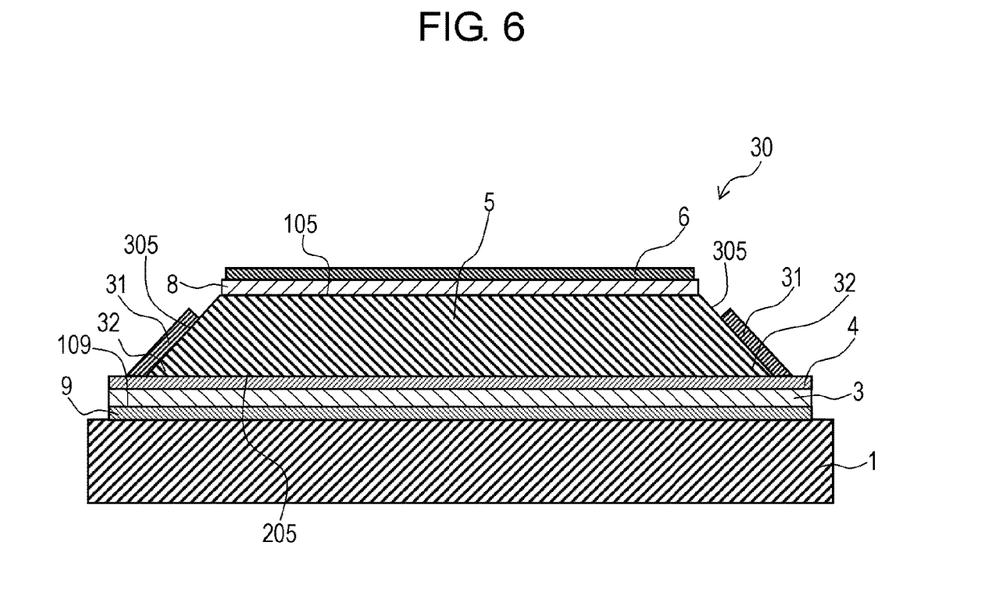
FIG. 6 is a schematic cross-sectional view of another piezoelectric device in accordance with the embodiment.

FIG. 6 is a cross-sectional view of another piezoelectric device 30 according to the embodiment. In FIG. 6, components identical to those of piezoelectric device 10 illustrated in FIGS. 1 and 2 or piezoelectric device 110 illustrated in FIG. 5A are dented by the same reference numerals.

Piezoelectric device 30 further includes cover 31 for covering side surface 305 of piezoelectric layer 5.

Piezoelectric device 30 includes substrate 1, lower electrode 3, lower bonding layer 4, piezoelectric layer 5, upper bonding layer 8, upper electrode 6, intermediate layer 9, and cover 31.

Side surface 305 of piezoelectric layer 5 includes peripheral portion 32 connected to lower surface 205. Cover 31 partially covers peripheral portion 32 of side surface 305 of piezoelectric layer 5. Accordingly, cover 31 can prevent peripheral portion 32 located on a side of lower electrode 3 of piezoelectric layer 5 from being peeled off.

For instance, in the case that piezoelectric layer 5 has a polygonal shape, cover 31 may be disposed on a part of a side or a vertex of piezoelectric layer 5. Further, cover 31 covers the entire circumference of peripheral portion 32 located on a portion of piezoelectric layer 5 at a side to lower bonding layer 4. If cover 31 is disposed to cover the entire circumference of peripheral portion 32, piezoelectric device 30 further prevent peripheral portion 32 of piezoelectric layer 5 from being peeled off.

Cover 31 is preferably made of the same material as lower bonding layer 4. In this case, in unsintered device 20 illustrated in FIG. 4D, the lower bonding material paste is additionally disposed to cover peripheral portion 32 located at a side to the lower electrode 3 which serves as a part of side surface 325 connected to lower surface 225 of piezoelectric material layer 25. After that, unsintered device 20 is fired to form cover 31.

If cover 31 is made of the same material as lower bonding layer 4, a piezoelectric material contained in cover 31 is bonded unitarily to the piezoelectric material of lower bonding layer 4 and the piezoelectric material of piezoelectric layer 5. Further, an electrode material contained in cover 31 is bonded unitarily to the electrode material of lower bonding layer 4. Accordingly, cover 31 is tightly bonded to lower bonding layer 4 and piezoelectric layer 5.

Note that, cover 31 may be made of the same material as lower electrode 3. In this case, the lower electrode material paste may be used to form cover 31 instead of the lower bonding material paste.

If the same electrode material as lower electrode 3 is employed, an electrode material contained in cover 31 is bonded unitarily to the electrode material of lower bonding layer 4. Accordingly, cover 31 is tightly bonded to lower bonding layer 4.

In these configurations, peripheral portion 32 located on piezoelectric layer 5 at a side to lower electrode 3 is provided between cover 31 and lower bonding layer 4. Accordingly, in piezoelectric device 30, peripheral portion 32 of piezoelectric layer 5 is hardly detached from lower bonding layer 4.

Note that, cover 31 is disposed away from upper electrode 6. Thus, cover 31 is not connected to upper electrode 6 electrically. This prevents an electrical connection between lower electrode 3 and upper electrode 6.

The above mentioned conventional piezoelectric device is likely to cause peel-off between the lower electrode and the piezoelectric layer in firing of the manufacturing process, or when used under such high temperature and high humidity conditions.

On the other hand, piezoelectric devices 10, 110, and 30 according to the embodiment have an advantage that peel-off of the piezoelectric layer can be prevented significantly in the firing of the manufacturing process or when used under such a high temperature and a high humidity. Especially, in the case that substrate 1 is made of a metal plate, such as a stainless steel plate having a large thermal expansion coefficient, the above advantage, i.e., preventing peel-off of piezoelectric layer 5 will be obtained markedly.

Further, since lower electrode 3 is bonded to piezoelectric layer 5 tightly, vibrations applied to piezoelectric devices 10, 110, and 30 transmit to piezoelectric layer 5 effectively, thereby converting the vibrations into electric energy efficiently.

As described above, the piezoelectric device and the manufacturing method of the piezoelectric device in accordance with one or more aspects of this disclosure are described based on one exemplary embodiment, but not limited to the exemplary embodiment. Unless departed from the scope of the present disclosure, various modifications thought by those skilled in the art may be applied to the exemplary embodiment, or elements in different exemplary embodiments may be combined to achieve the one or multiple aspects.

The piezoelectric devices according to the embodiment are useful for energy harvesting devices used in, e.g. vibration power generation.

In the embodiment, terms, such as "upper surface," "lower surface," "upper bonding layer," and "lower bonding layer", indicating directions indicate a relative direction determined by a positional relationship between components of the piezoelectric device, but do not indicate absolute directions, such as a vertical direction.

What is claimed is:

1. A piezoelectric device comprising:
   a substrate;
   a lower electrode disposed above the substrate, the lower electrode being made of a first electrode material;
   a lower bonding layer disposed on an upper surface of the lower electrode;
   a piezoelectric layer disposed on an upper surface of the lower bonding layer, the piezoelectric layer containing a piezoelectric material; and
   an upper electrode disposed above an upper surface of the piezoelectric layer,
   wherein the lower bonding layer includes a first electrode material portion containing the first electrode material and a first piezoelectric material portion containing the piezoelectric material,
   wherein the first electrode material portion and the first piezoelectric material portion interdigitate with each other in the lower bonding layer,
   wherein the first electrode material portion includes a plurality of first protrusions bonded to the lower electrode and protruding from the lower electrode toward the piezoelectric layer,
   wherein the first piezoelectric material portion is bonded to the piezoelectric layer, and
   wherein the plurality of first protrusions are covered with the first piezoelectric material portion in the lower bonding layer.

2. The piezoelectric device according to claim 1,
   wherein each first protrusion of the plurality of first protrusions has a root bonded to the lower electrode and a tip end opposite to the root,
   wherein the each first protrusion has a first portion having a first diameter and a second portion located having a second diameter larger than the first diameter, the second portion being closer to the root than the first portion, and
   wherein the first electrode material portion and the first piezoelectric material portion are bonded to each other via the plurality of first protrusions.

3. The piezoelectric device according to claim 2, wherein a ratio of a weight of the first electrode material portion to a weight the first piezoelectric material portion in the lower bonding layer ranges from 12/88 to 55/45.

4. The piezoelectric device according to claim 1, further comprising:
   an upper bonding layer disposed between the piezoelectric layer and the upper electrode,
   wherein the upper electrode is made of a second electrode material,
   wherein the upper bonding layer includes a second piezoelectric material portion containing the piezoelectric material and a second electrode material portion containing the second electrode material, and
   wherein the second electrode material portion and the second piezoelectric material portion interdigitate with each other in the upper bonding layer.

5. The piezoelectric device according to claim 4,
   wherein the second electrode material portion includes a plurality of second protrusions bonded to the upper electrode and protruding from the upper electrode toward the piezoelectric layer,
   wherein the second piezoelectric material portion is bonded to the piezoelectric layer, and
   wherein the plurality of second protrusions are covered with the second piezoelectric material portion in the upper bonding layer.

6. The piezoelectric device according to claim 1, wherein the substrate is made of stainless steel.

7. The piezoelectric device according to claim 1,
   wherein the first piezoelectric material portion includes a plurality of protrusions bonded to the piezoelectric layer and protruding from the piezoelectric layer toward the lower electrode, wherein the first electrode material portion is bonded to the lower electrode, and wherein the plurality of protrusions are covered with the first electrode material portion in the lower bonding layer.

8. The piezoelectric device according to claim 1, wherein the piezoelectric layer has a lower surface located on the upper surface of the lower bonding layer and a side surface connected to the upper surface and the lower surface of the piezoelectric layer, and the side surface of the piezoelectric layer includes a peripheral portion connected to the lower surface of the piezoelectric layer, the piezoelectric device further comprising a cover for covering a peripheral portion of the side surface of the piezoelectric layer.

9. The piezoelectric device according to claim 8, wherein the cover is made of material identical to material of the lower bonding layer.

10. The piezoelectric device according to claim 8, wherein the cover is made of the first electrode material.

11. A piezoelectric device comprising:
a substrate;
a lower electrode disposed above the substrate, the lower electrode being made of a first electrode material;
a lower bonding layer disposed on an upper surface of the lower electrode;
a piezoelectric layer disposed on an upper surface of the lower bonding layer, the piezoelectric layer containing a piezoelectric material; and
an upper electrode disposed above an upper surface of the piezoelectric layer,
wherein the lower bonding layer includes a first electrode material portion containing the first electrode material and a first piezoelectric material portion containing the piezoelectric material,
wherein the first electrode material portion and the first piezoelectric material portion interdigitate with each other in the lower bonding layer,
wherein the first piezoelectric material portion includes a plurality of protrusions bonded to the piezoelectric layer and protruding from the piezoelectric layer toward the lower electrode,
wherein the first electrode material portion is bonded to the lower electrode, and
wherein the plurality of protrusions are covered with the first electrode material portion in the lower bonding layer.

12. The piezoelectric device according to claim 11,
wherein the first electrode material portion includes a plurality of first protrusions bonded to the lower electrode and protruding from the lower electrode toward the piezoelectric layer,
wherein the first piezoelectric material portion is bonded to the piezoelectric layer,
wherein the plurality of first protrusions are covered with the first piezoelectric material portion in the lower bonding layer,
wherein each first protrusion of the plurality of first protrusions has a root bonded to the lower electrode and a tip end opposite to the root,
wherein the each first protrusion has a first portion having a first diameter and a second portion located having a second diameter larger than the first diameter, the second portion being closer to the root than the first portion, and
wherein the first electrode material portion and the first piezoelectric material portion are bonded to each other via the plurality of first protrusions.

13. The piezoelectric device according to claim 12, wherein a ratio of a weight of the first electrode material portion to a weight the first piezoelectric material portion in the lower bonding layer ranges from 12/88 to 55/45.

14. The piezoelectric device according to claim 11, further comprising:
an upper bonding layer disposed between the piezoelectric layer and the upper electrode,
wherein the first electrode material portion includes a plurality of first protrusions bonded to the lower electrode and protruding from the lower electrode toward the piezoelectric layer,
wherein the first piezoelectric material portion is bonded to the piezoelectric layer,
wherein the plurality of first protrusions are covered with the first piezoelectric material portion in the lower bonding layer,
wherein the upper electrode is made of a second electrode material,
wherein the upper bonding layer includes a second piezoelectric material portion containing the piezoelectric material and a second electrode material portion containing the second electrode material, and
wherein the second electrode material portion and the second piezoelectric material portion interdigitate with each other in the upper bonding layer.

15. The piezoelectric device according to claim 14,
wherein the second electrode material portion includes a plurality of second protrusions bonded to the upper electrode and protruding from the upper electrode toward the piezoelectric layer,
wherein the second piezoelectric material portion is bonded to the piezoelectric layer, and
wherein the plurality of second protrusions are covered with the second piezoelectric material portion in the upper bonding layer.

16. The piezoelectric device according to claim 11, wherein the substrate is made of stainless steel.

17. The piezoelectric device according to claim 11, wherein the piezoelectric layer has a lower surface located on the upper surface of the lower bonding layer and a side surface connected to the upper surface and the lower surface of the piezoelectric layer, and the side surface of the piezoelectric layer includes a peripheral portion connected to the lower surface of the piezoelectric layer, the piezoelectric device further comprising a cover for covering a peripheral portion of the side surface of the piezoelectric layer.

18. The piezoelectric device according to claim 17, wherein the cover is made of material identical to material of the lower bonding layer.

19. The piezoelectric device according to claim 17, wherein the cover is made of the first electrode material.

* * * * *